(12) United States Patent
Botka et al.

(10) Patent No.: US 6,299,459 B1
(45) Date of Patent: Oct. 9, 2001

(54) COMPRESSIBLE CONDUCTIVE INTERFACE

(75) Inventors: Julius K Botka; Frank E Hamlin, both of Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/776,337

(22) Filed: Feb. 2, 2001

(51) Int. Cl.[7] .................................................. A01R 12/00
(52) U.S. Cl. .................................................. 439/66; 439/71
(58) Field of Search .................................. 439/66, 71, 91, 439/70, 72, 73, 525, 526

(56) References Cited

U.S. PATENT DOCUMENTS

| | | | |
|---|---|---|---|
| 5,609,489 | 3/1997 | Bickford et al. | 439/72 |
| 6,062,870 | * 5/2000 | Hopfer, III et al. | 439/66 |
| 6,183,266 | * 2/2001 | Turner | 439/66 |
| 6,210,173 | * 4/2001 | Matsunaga | 439/66 |

OTHER PUBLICATIONS

Burn–In & Test Socket Workshop Proceedings; Feb. 27–29, 2000, Hilton Mesa Pavilion Hotel, Mesa, Arizona; Sponsored By The IEEE Computer Society, Test Technology Technical Council; 11 Pages.

* cited by examiner

Primary Examiner—Tho D. Ta
Assistant Examiner—Ann McCamey
(74) Attorney, Agent, or Firm—John L. Imperato

(57) ABSTRACT

A compressible conductive interface provides electrical continuity between a first group of contacts and a second group of contacts in the presence of a compression force applied between the groups of contacts. An insulating housing in the compressible conductive interface has one or more channels and a matrix of apertures. Compressible bars in the compressible conductive interface each have a pair of opposing sides, a base and a nose and are positioned in the channels so that the nose of the compressible bar is at a bottom of the channel into which the compressible bar is positioned. A series of conductive elements, each having a conductive frame and a conductive slider, are also included in the compressible conductive interface. Each conductive element of the compressible conductive interface has a neutral state and a loaded state.

14 Claims, 5 Drawing Sheets

COMPRESSIBLE CONDUCTIVE INTERFACE

BACKGROUND OF THE INVENTION

Circuit testers characterize performance of electronic circuits and systems. A critical component of a circuit tester is a conductive interface that enables conductors carrying stimulus/response signals to have electrical continuity with electrical contacts of the circuits and systems being characterized. As the trend in modern circuits and systems is toward higher frequency operation and smaller physical size, there is motivation to correspondingly improve the conductive interfaces so that they do not limit the performance capability, and hence the utility, of the circuit testers. To accommodate the high frequency operation and small physical size of the circuits and systems characterized by the circuit testers, the conductive interfaces preferably have low inductance and closely spaced conductive elements.

SUMMARY OF THE INVENTION

A compressible conductive interface constructed according to the preferred embodiment of the present invention has low inductance conductive elements that are closely spaced. The compressible conductive interface provides electrical continuity between a first group of contacts and a second group of contacts in the presence of a compression force applied between the groups of contacts. An insulating housing in the compressible conductive interface has one or more channels that are recessed into a first side of the insulating housing and a matrix of apertures at a bottom of the channels that extend through the insulating housing to a second side of the insulating housing.

The compressible conductive interface includes one or more compressible bars. Each compressible bar has a pair of opposing sides, a base adjacent to the opposing sides, and a nose adjacent to the opposing sides and opposite to the base. The compressible bars are positioned in predesignated ones of the one or more channels so that the nose of the compressible bar is at the bottom of the channel into which the compressible bar is positioned.

A series of conductive elements are included in the compressible conductive interface. Each conductive element includes a conductive frame with a frame bottom and a pair of opposing walls extending from the frame bottom. The opposing walls each have an inner surface that terminates in a stop. Each conductive frame is positioned with the frame bottom contacting the base of a corresponding compressible bar and with the opposing walls straddling the opposing sides of the compressible bar so that the opposing walls of the conductive frame extend beyond the nose of the compressible bar and into a corresponding aperture in the matrix. The frame bottoms are adapted to mate with the second group of contacts.

Each conductive element also includes a conductive slider with a pair of legs extending from a head. Each of the legs is terminated in a corresponding foot. The legs are positioned in a corresponding aperture in the matrix and are received between the pair of opposing walls of a corresponding conductive frame, so that a bottom of each foot contacts the nose of the compressible bar. An end of each foot slidably contacts the inner surface of a corresponding one of the opposing walls of the corresponding conductive frame with an associated contact force. The heads of the conductive sliders extend beyond the second side of the insulating housing and are adapted to mate with the first group of contacts.

Each conductive element of the compressible conductive interface has a neutral state wherein the compressible bar biases the conductive slider so that a top of each foot rests against the stop on a corresponding one of the opposing walls of the conductive frame of the neutral conductive element. Each conductive element also has a loaded state wherein the head of the conductive slider is biased toward the frame bottom of the conductive frame of the loaded conductive element. In this loaded state, the compression force applied between the first group of contacts and the second group of contacts reduces a distance between the nose and the base of the compressible bar as the compression force is increased. The nose translates a component of the compression force so that the contact force between the ends of the feet of the conductive slider and the inner surfaces of the opposing walls of the corresponding conductive frame proportionately increases as the compression force F is increased.

DETAILED DESCRIPTION OF THE PREFERRED EMBODIMENT

Figure 1:
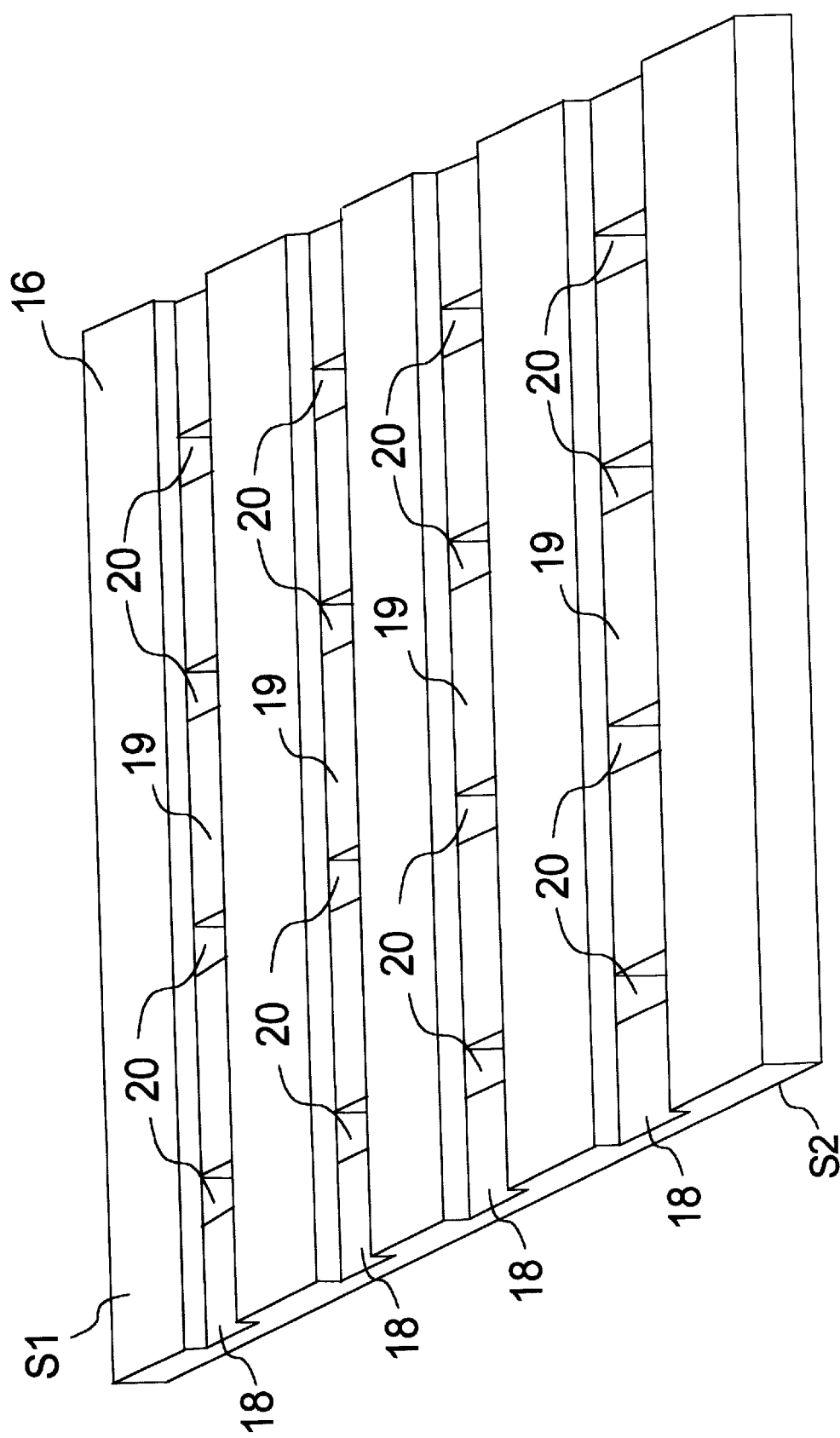
FIG. 1 shows an insulating housing included in the compressible conductive interface constructed according to the preferred embodiment of the present invention.

FIGS. 1–4 show aspects of a compressible conductive interface 10 constructed according to the preferred embodiment of the present invention. The compressible conductive interface 10 provides electrical continuity between a first group of contacts 12 and a second group of contacts 14 in the presence of a compression force F applied between the first group of contacts 12 and the second group of contacts 14. An insulating housing 16 (shown in FIG. 1) included in the compressible conductive interface 10 has one or more channels 18 that are recessed into a first side S1 of the insulating housing 16. The insulating housing 16 also has a matrix of apertures 20 at a bottom 19 of the channels 18 that extend through the insulating housing 16 to a second side S2 of the insulating housing 16.

Figure 2:
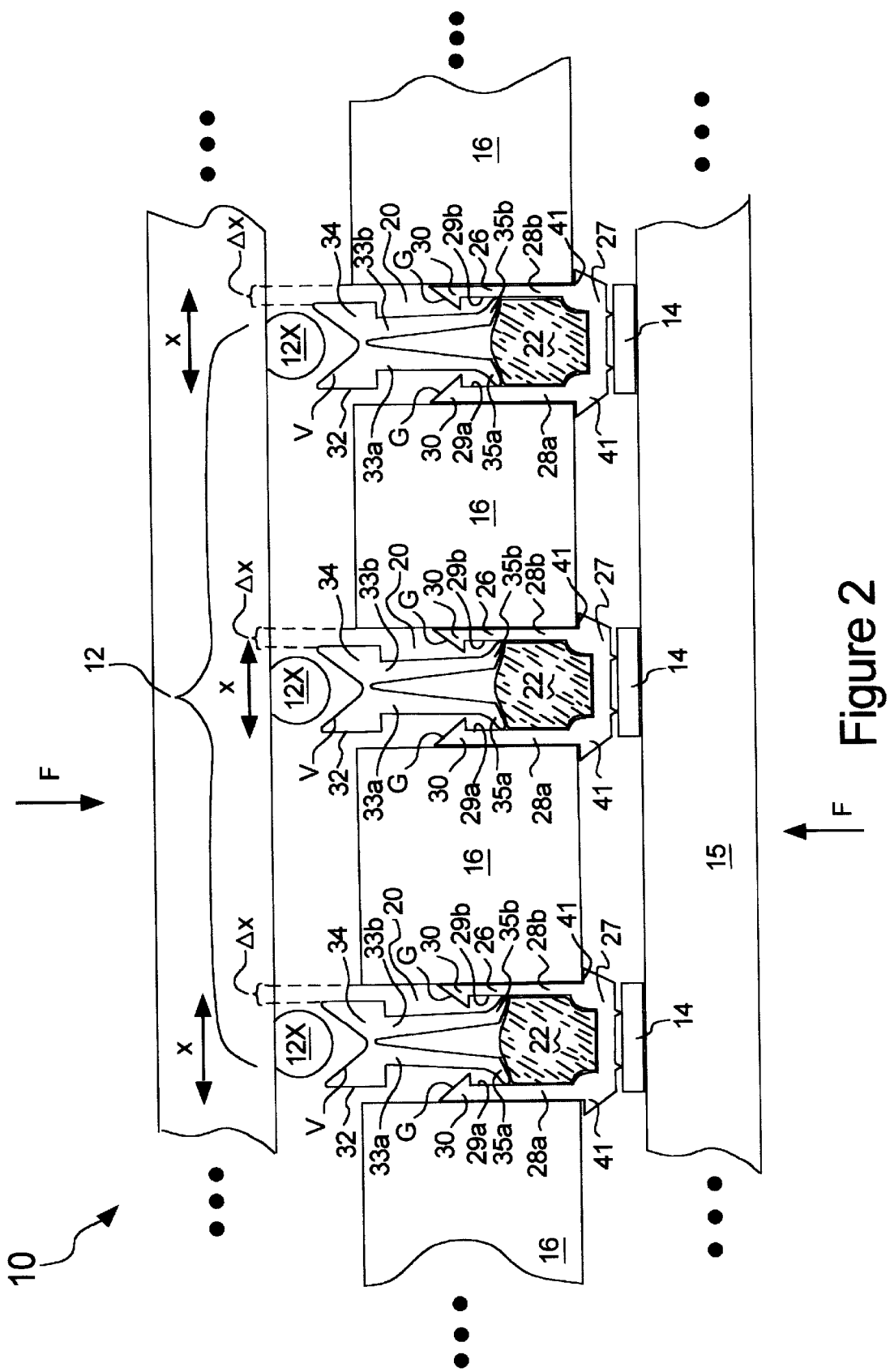
FIG. 2 is a cross-sectional view of the compressible conductive interface constructed according to the preferred embodiment of the present invention.
Figure 3A:
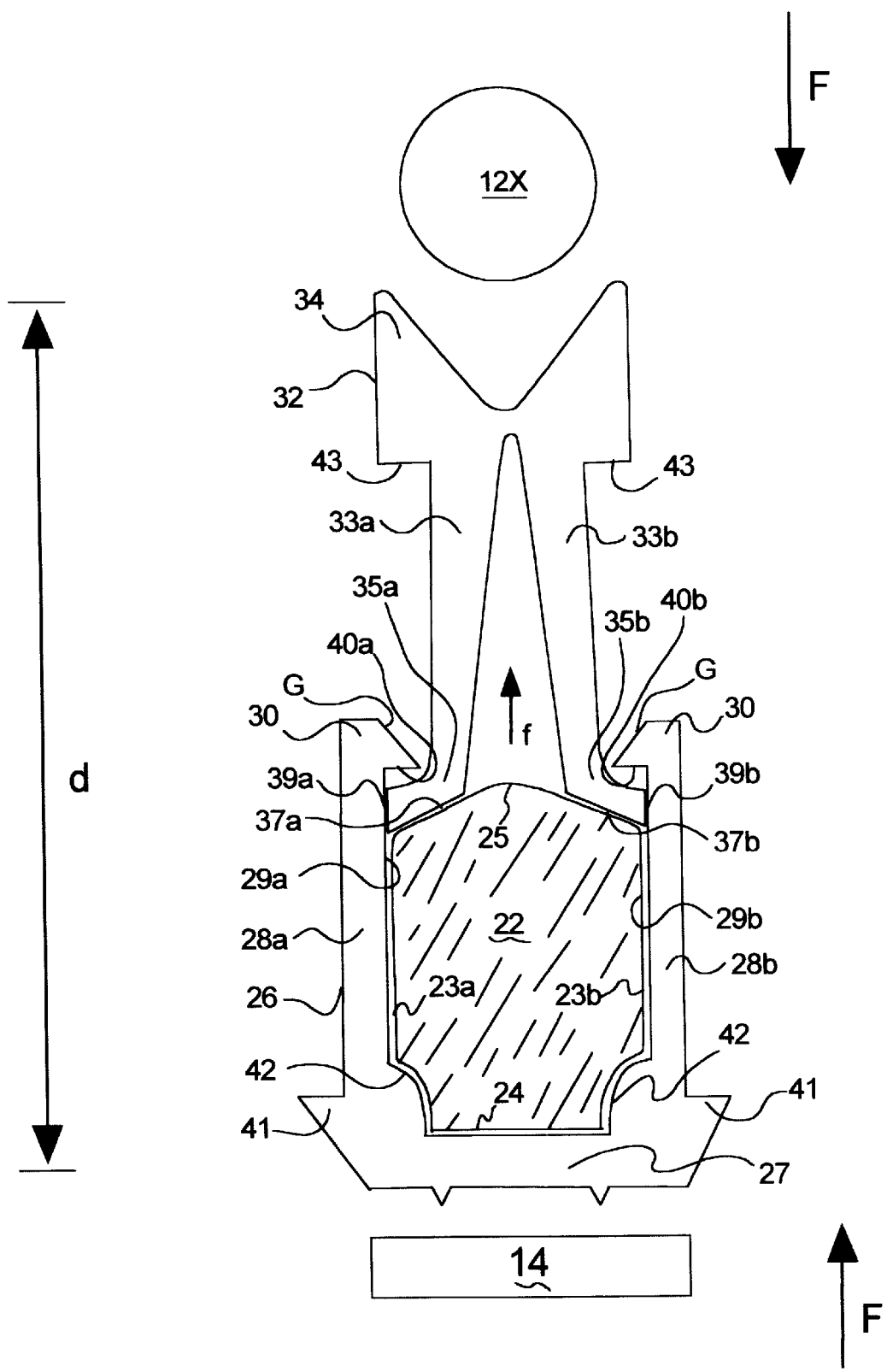
FIGS. 3A–3B are detailed views of the compressible conductive interface constructed according to the preferred embodiment of the present invention.
Figure 3B:
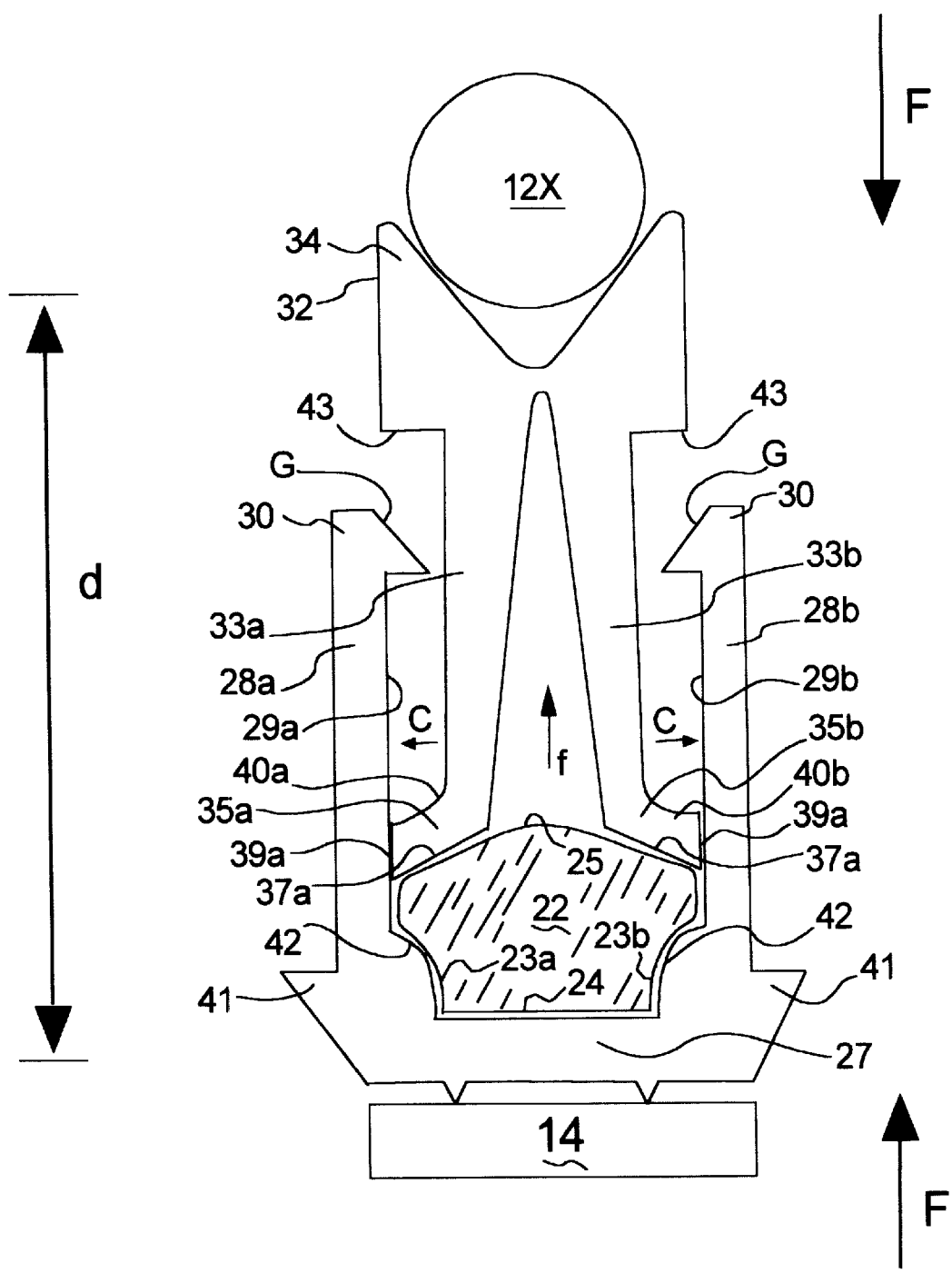

The compressible conductive interface 10 includes one or more compressible bars 22 (shown in FIG. 2 and FIGS. 3A–3B). Each compressible bar 22 has a pair of opposing sides 23a, 23b, a base 24 adjacent to the opposing sides 23a, 23b, and a nose 25 adjacent to the opposing sides 23a, 23b and opposite to the base 24. The compressible bars 22 are positioned in predesignated ones of the one or more channels 18 so that the nose 25 of the compressible bar 22 is at the bottom 19 of the channel 18 into which the compressible bar 22 is positioned.

A series of conductive elements are also included in the compressible conductive interface 10. Each conductive element includes a conductive frame 26 and a conductive slider 32. Each conductive frame 26 has a frame bottom 27 and a pair of opposing walls 28a, 28b extending from the frame bottom 27. Each opposing wall 28a, 28b has an inner surface 29a, 29b that terminates in a stop 30. To assemble the compressible conductive interface 10, the conductive frames 26 are positioned with the frame bottoms 27 contacting the base 24 of a corresponding compressible bar 22 and with the opposing walls 28a, 28b of the conductive frames 26 straddling the opposing sides 23a, 23b of the compressible bar 22 so that the opposing walls 28a, 28b extend beyond the nose 25 of the compressible bar 22 and into a corresponding aperture 20 in the matrix. The frame bottoms 27 are adapted to mate with the second group of contacts 14.

The conductive slider 32 of each conductive element has a pair of legs 33a, 33b extending from a head 34. Each of the legs 33a, 33b is terminated in a corresponding foot 35a, 35b. To assemble the compressible conductive interface 10, the legs 33a, 33b are inserted into a corresponding aperture 20 in the matrix and are received between the pair of opposing walls 28a, 28b of a corresponding conductive frame 26, so that a bottom 37a, 37b of each foot 35a, 35b contacts the nose 25 of the compressible bar 22. The ends 39a, 39b of the feet 35a, 35b slidably contact the inner surfaces 29a, 29b of the opposing walls 28a, 28b of the conductive frames 26 with an associated contact force C. The heads 34 of the conductive sliders 32 extend beyond the second side S2 of the insulating housing 16 and are adapted to mate with the first group of contacts 12.

Each conductive element of the compressible conductive interface 10 has a neutral state, as shown in FIG. 3A, wherein the compressible bar 22 biases the conductive slider 32 of the neutral conductive element so that a top 40a, 40b of each foot 35a, 35b rests against the stop 30 on a corresponding one of the opposing walls 28a, 28b of the conductive frame 26 of the neutral conductive element. Each conductive element of the compressible conductive interface 10 also has a loaded state, as shown in FIG. 3B, wherein the head 34 of the conductive slider 32 of the loaded conductive element is biased toward the frame bottom 27 of the conductive frame 26 of the loaded conductive element. In this loaded state, the compression force F applied between the first group of contacts 12 and the second group of contacts 14 reduces a distance d between the nose 25 and the base 27 of the compressible bar 22 as the compression force F is increased. The nose 25 translates a component of the compression force F so that the contact force C, between the ends 39a, 39b of the feet 35a, 35b of the conductive slider 32 and the inner surfaces 29a, 29b of the opposing walls 28a, 28b of the corresponding conductive frame 26, proportionately increases as the compression force F is increased.

FIG. 1 shows the insulating housing 16 included in the compressible conductive interface 10 constructed according to the preferred embodiment of the present invention. The one or more channels 18 formed on the first side S1 of the insulating housing 16 in this example, the channels 18 are linear and equally spaced in rows. The matrix of apertures 20 in the insulating housing 16 formed between the bottoms 19 of the channels 18 and the second side S2 of the insulating housing 16, in this example, forms a grid. This arrangement of channels 18 and apertures 20 enables for convenient placement of the series of conductive frames 26 and conductive sliders 32 using a row and column designation. However, other configurations of channels 18 and apertures 20 in the insulating housing 16 are alternatively used to accommodate the arrangement of the first group of conductors 12 and the second group of conductors 14. In this example, the insulating housing 16 is formed from fiber-loaded plastic. Plastic, fiberglass, ceramic or other insulating material with sufficient mechanical strength is alternatively used.

FIG. 2 is a cross-sectional view of the compressible conductive interface 10 constructed according to the preferred embodiment of the present invention. The first group of contacts 12, as an example, includes solder balls 12x, commonly formed on integrated circuits and hybrid microcircuits (not shown). The head 34 of each of the conductive sliders 32 includes a Vee-groove V adapted to receive one of the solder balls 12x. A predesignated clearance Δx of the heads 34 in the apertures 20 of the insulating housing 16 provide lateral freedom in a direction of an arrow X to enable self alignment of the heads 34 with the solder balls 12x, ensuring the integrity of the electrical coupling when the heads 34 mate with the solder balls 12x. When the first group of contacts 12 includes planar contacts (not shown), such as conductive traces or pads on circuit boards, circuits or electrical devices, as an alternative to the Vee-groove V, the shape of the head 34 is adapted to receive the planar contacts. For example, the head 34 has a shape optionally including one or more of ridges, bumps, and knurls (not shown) to facilitate mating of the heads 34 with the first group of contacts 12.

The second group of contacts 14 are shown to be planar contacts, such as conductive traces on a printed circuit board 15. To facilitate mating with the second group of contacts 14 of this type, the frame bottoms 27 optionally include one or more of ridges, bumps, and knurls, to facilitate mating of the frame bottoms 27 with the second group of contacts 14. When the second group of contacts 14 are solderballs (not shown), the frame bottoms 27 optionally include Vee-groves adapted to receive the solder balls.

A flange 41 is optionally included in the frame bottoms 27 to limit penetration of the opposing walls 28a, 28b of the conductive frames 26 into the corresponding apertures 20 in the insulating housing 16. The stops 30 on the opposing walls 28a, 28b of the conductive frames 26 optionally include tapered guides G facilitating positioning of the legs 33a, 33b of the conductive sliders 32 between the opposing walls 28a, 28b of the conductive frames 26 of the conductive elements.

Referring to the detailed views of the compressible conductive interface 10 shown in FIGS. 3A–3B, the feet 35a, 35b terminating the legs 33a, 33b of the conductive sliders 32 have bottoms 37a, nose 25 is shown as a convexly curved arc. Alternatively, the nose 25 has a profile that is a trapezoid, triangle, or other shape capable of translating a component of the compression force F to the contact force C. The ends 39a, 39bof the feet 35a, 35b slidably contact the inner surfaces 29a, 29b of the opposing walls 28a, 28b of the corresponding conductive frame 26 as relative position of the heads 34 and the frame bottoms 27 varies in response to variations in the applied compression force F between the first group of contacts 12 and the second group of contacts 14. Electrical continuity, and low inductance, between the heads 34 and the corresponding conductive frames 26 of conductive elements in the compressible conductive interface 10 are provided by redundant conductive paths via the legs 33a, 33b of the conductive slider 32.

In FIG. 3A, the conductive element of the compressible conductive interface 10 is in the neutral state. In the neutral state, the compressible bar 22 biases the conductive slider 32 so that a top 40a, 40b of each foot 35a, 35b of the conductive slider 32 rests against the stops 30 of the opposing walls 28a, 28b of the conductive frame 26. The bias is created by the tendency of the compressible bar 22 to fill a space enclosed by the conductive frame 26 and the bottoms 37a, 37b of the feet 35a, 35b of the conductive slider 32. Magnitude of the bias depends on the size of the compressible bar 22 relative to the enclosed space and the resilience of the compressible bar 22. Bias increases as the ratio of the size of the compressible bar 22 to the enclosed space increases. For a compressible bar 22 of predesignated resilience and size, bias of the feet 35a, 35b against the stops 30 is also increased by optionally included fillets 42 in the conductive frame 26 to reduce the space enclosed by the conductive frame 26 and the bottoms 37a, 37b of the feet 35a, 35b of the conductive slider 32. The compressible bar 22 also provides a restorative force f that returns the conductive element of the compressible conductive interface 10 from the loaded state (shown in FIG. 3B) back to the neutral state (shown in FIG. 3A), when the compression force F is reduced or removed. Typically, the compressible bar 22 is an insulator so that electrical isolation between conductive elements in the compressible conductive interface 10 is provided.

In FIG. 3B, the conductive element of the compressible conductive interface 10 is in the loaded state. In the loaded state, the compression force F applied between the first group of contacts 12 and the second group of contacts 14 reduces the distance d between the nose 25 and the base 24 of the compressible bar 22. The shape of the nose 25 pressing against the bottoms 37a, 37b of the feet 35a, 35b translates a component of the compression force F to proportionately increase the contact force C as the compression force F is increased. As the compression force F decreases, the contact force C proportionately decreases to reduce friction between the ends 39a, 39b of the feet 35a, 35b and the inner surfaces 29a, 29b of the opposing walls 28a, 28b of the conductive frame 26, thereby enabling the restorative force f provided by the compressible bar 22 to urge the conductive element of the compressible conductive interface 10 from the loaded state back to the neutral state. An overhang 43 on the head 34 of the conductive slider 32 limits penetration of the conductive slider 32 within the conductive frame 26, by contacting the stops 30, or alternatively, by contacting an optional shelf (not shown) formed in the aperture 20.

Figure 4:
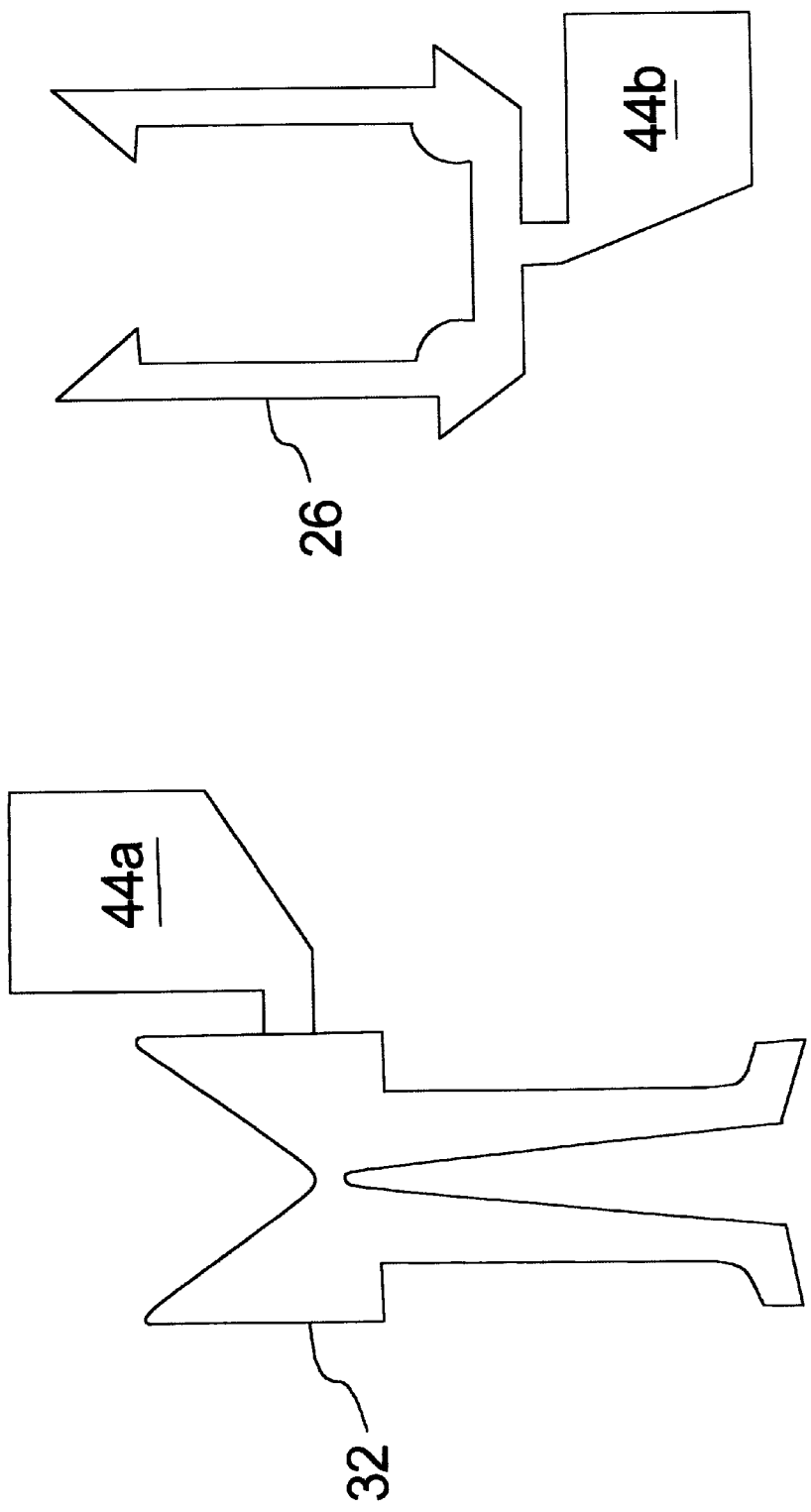
FIG. 4 shows a conductive slider and conductive frame, having optionally included break-away tabs, for use in the compressible conductive interface of FIGS. 2 and FIGS. 3A–3B.

FIG. 4 shows the conductive slider 32 and the conductive frame 26, having optionally included break-away tabs 44a, 44b. The break-away tabs 44a, 44b are optionally included on one or both of the conductive slider 32 and the conductive frame 26 to facilitate handling. Typically, the break-away tabs are removed following assembly of the compressible conductive interface 10.

What is claimed is:

1. An interface for providing electrical continuity between a first group of contacts and a second group of contacts in the presence of an applied compression force between the first group of contacts and the second group of contacts, comprising:

an insulating housing having at least one channel recessed in a first side and a matrix of apertures between a bottom of the at least one channel and a second side of the insulating housing;

at least one compressible bar having a pair of opposing sides, a base adjacent to the opposing sides, and a convex nose adjacent to the opposing sides and opposite to the base, the at least one compressible bar positioned in designated ones of the at least one channel with the nose at the bottom of the at least one channel; and a series of conductive elements, each conductive element including a conductive frame with a frame bottom and a pair of opposing walls extending from the frame bottom, each of the opposing walls having an inner surface terminated in a stop, each conductive frame positioned with the frame bottom contacting the base of the at least one compressible bar and the opposing walls straddling the opposing sides of the at least one compressible bar and extending beyond the nose of the at least one bar into a corresponding aperture in the matrix, the frame bottoms of the conductive elements adapted to mate with the second group of contacts, and each conductive element including a conductive slider with a pair of legs extending from a head, each of the legs terminated in a foot, the legs received between the pair of opposing walls of a corresponding conductive frame, so that a bottom of each foot contacts the nose of the bar and an end of each foot slidably contacts the inner surface of a corresponding one of the opposing walls of the conductive frame with a contact force, the heads extending beyond the second side of the insulating housing and adapted to mate with the first group of contacts, each conductive element having a neutral state wherein the compressible bar biases the conductive slider of the conductive element so that a top of each foot rests against the stop on a corresponding one of the opposing walls of the conductive frame of the conductive element, and having a loaded state wherein the head of the conductive slider of the conductive element is biased toward the frame bottom of the conductive frame of the conductive element by the compression force applied between the first group of contacts and the second group of contacts, the compression force reducing a distance between the nose and the base of the at least one compressible bar as the compression force is increased, the nose translating a component of the compression force to proportionately increase the contact force as the compression force is increased.

2. The interface of claim 1 wherein the head of each conductive slider includes a break-away tab.

3. The interface of claim 1 wherein the stops of the pairs of opposing walls in the series of conductive frames each include a tapered guide, facilitating insertion of the legs of the conductive sliders between the opposing walls of the conductive frames.

4. The interface of claim 3 wherein the head of each conductive slider includes a break-away tab.

5. The interface of claim 1 wherein the bottom of each conductive frame includes a flange limiting penetration of the opposing walls of the frame into the corresponding aperture.

6. The interface of claim 3 wherein the bottom of each conductive frame includes a flange limiting penetration of the opposing walls of the conductive frame into the corresponding aperture.

7. The interface of claim 1 wherein the head of each conductive slider has a Vee-groove adapted to receive a solder ball.

8. The interface of claim 1 wherein the head of each conductive slider has a predesignated clearance within the corresponding aperture in the insulating housing.

9. The interface of claim 3 wherein the head of each conductive slider has a Vee-groove adapted to receive a solder ball.

10. The interface of claim 9 wherein the head of each conductive slider has a predesignated clearance within the corresponding aperture in the insulating housing.

11. The interface of claim 2 wherein the head of each conductive slider has a Vee-groove adapted to receive a solder ball.

12. The interface of claim 11 wherein the head of each conductive slider has a predesignated clearance within the corresponding aperture in the insulating housing.

13. The interface of claim 6 wherein the head of each conductive slider has a Vee-groove adapted to receive a solder ball.

14. The interface of claim 13 wherein the head of each conductive slider has a predesignated clearance within the corresponding aperture in the insulating housing.

* * * * *